United States Patent
Kim

(10) Patent No.: US 11,031,450 B2
(45) Date of Patent: Jun. 8, 2021

(54) LIGHT EMITTING DISPLAY APPARATUS FOR IMPROVING LIGHT EXTRACTION EFFICIENCY

(71) Applicant: LG Display Co., Ltd., Seoul (KR)

(72) Inventor: NamSu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 69 days.

(21) Appl. No.: 16/527,536

(22) Filed: Jul. 31, 2019

(65) Prior Publication Data

US 2020/0075699 A1 Mar. 5, 2020

(30) Foreign Application Priority Data

Aug. 31, 2018 (KR) .................... 10-2018-0103245

(51) Int. Cl.
*H01L 27/32* (2006.01)

(52) U.S. Cl.
CPC ...... *H01L 27/3258* (2013.01); *H01L 27/3246* (2013.01); *H01L 27/3248* (2013.01)

(58) Field of Classification Search
CPC combination set(s) only.
See application file for complete search history.

(56) References Cited

U.S. PATENT DOCUMENTS

| | | | |
|---|---|---|---|
| 2007/0290607 A1* | 12/2007 | Okada | H01L 51/5268 313/504 |
| 2008/0024402 A1* | 1/2008 | Nishikawa | H05B 33/22 345/82 |
| 2015/0263235 A1* | 9/2015 | Shin | H01L 27/1237 257/72 |
| 2018/0211979 A1* | 7/2018 | Lee | H01L 51/5209 |
| 2019/0348624 A1* | 11/2019 | Kim | H01L 27/3258 |
| 2020/0185655 A1* | 6/2020 | Jo | H01L 27/322 |

* cited by examiner

*Primary Examiner* — Nduka E Ojeh
(74) *Attorney, Agent, or Firm* — Birch, Stewart, Kolasch & Birch LLP

(57) ABSTRACT

A light emitting display apparatus includes a substrate which includes a first area and a second area, an insulating layer on the substrate and having an uneven surface, a first bank on the insulating layer in the second area and formed of a black material, a first electrode on the insulating layer in the first area where the first electrode covers at least a part of a side surface of the first bank, a light emitting layer on the first electrode, and a second electrode on the light emitting layer.

14 Claims, 9 Drawing Sheets

LIGHT EMITTING DISPLAY APPARATUS FOR IMPROVING LIGHT EXTRACTION EFFICIENCY

CROSS-REFERENCE TO RELATED APPLICATIONS

This application claims the priority of Korean Patent Application No. 10-2018-0103245 filed on Aug. 31, 2018, in the Korean Intellectual Property Office, the disclosure of which is incorporated herein by reference into the present application.

BACKGROUND

Field

The present disclosure relates to a light emitting display apparatus, and more particularly, to a light emitting display apparatus with an improved light extracting efficiency and an improved outdoor visibility.

Description of the Related Art

Currently, in a full-scale information era, a field of display apparatuses which visually express electrical information signals has been rapidly developed and studies have continued in order to improve performances of various display apparatuses such as thin-thickness, light weight, and low power consumption.

Among various display apparatuses, a light emitting display apparatus is a self-emitting display apparatus where a separate light source is not necessary, which is different from a liquid crystal display apparatus. Therefore, the light emitting display apparatus can be manufactured to have light weight and small thickness. Further, since the light emitting display apparatus is driven at a low voltage, it is advantageous not only in terms of power consumption, but also in terms of color implementation, a response speed, a viewing angle, a contrast ratio (CR). Therefore, it is expected to be utilized more in various fields.

Light emitted from a light emitting layer of the light emitting display apparatus passes through various components of the light emitting display apparatus to be output to the outside of the light emitting display apparatus. However, some of the light emitted from the light emitting layer may not be output to the outside of the light emitting display apparatus but may be confined inside the light emitting display apparatus so that the light extraction efficiency of the light emitting display apparatus becomes an issue.

For example, there is a problem in that some light among the light emitted from the light emitting layer is confined in the light emitting display apparatus due to a total reflection loss, a waveguide loss, and a surface plasmon loss. Here, the total reflection loss refers to degradation of light extraction efficiency due to the light confined in the light emitting display apparatus by the total reflection at an interface between a substrate and air, among the light emitted from the light emitting layer. The waveguide loss refers to degradation of light extraction efficiency due to the light confined therein because of the total reflection at the interface of components in the light emitting display apparatus. The surface plasmon loss occurs when the light vibrates free electrons of the metal surface due to a phenomenon that light is absorbed onto a metal surface during a process of entering and propagating the light so that the light cannot be reflected or transmitted which degrades the light extraction efficiency.

SUMMARY

The inventor of the present disclosure invented a light emitting display apparatus with a new structure which reduces the surface plasmon loss, among various losses which degrade the light extraction efficiency.

In the meantime, the inventor of the present disclosure found out that when the light emitting device is formed to be uneven, there is a problem in that scattering reflectance in an off-state of the light emitting display apparatus is increased so that a visual feel in an off-state, that is, a black luminance can be degraded and thus not only the outdoor visibility, but also the contrast ratio can be degraded.

Therefore, the inventor of the present disclosure invented a light emitting display apparatus having a new structure which improves an outdoor visibility.

Further, the inventor of the present disclosure examined to dispose an insulating layer formed of a black material on an uneven surface between light emitting devices to improve the black luminance. However, the inventor of the present disclosure recognized that when the insulating layer formed of a black material is used, the degradation of the contrast ratio is suppressed or reduced, but the luminance may be lowered.

Therefore, the inventor of the present disclosure invented a light emitting display apparatus having a new structure which improves not only the outdoor visibility, but also the luminance of the apparatus.

An object to be achieved by the present disclosure is to provide a light emitting display apparatus which is capable of improving the light extraction efficiency by minimizing the surface plasmon loss.

Further, another object to be achieved by the present disclosure is to provide a light emitting display apparatus in which a bank defining an emission area is configured by a black material to reduce scattering reflectance in an off state of the display apparatus, thereby improving the outdoor visibility.

Further, another object to be achieved by the present disclosure is to provide a light emitting display apparatus which compensates a luminance which can be reduced by the black bank even when the black bank is used.

Another object of the present disclosure is to provide an improved light emitting display apparatus which address the limitations and disadvantages associated with various light emitting display apparatuses of the background art.

Objects of the present disclosure are not limited to the above-mentioned objects, and other objects, which are not mentioned above, can be clearly understood by those skilled in the art from the following descriptions.

According to an aspect of the present disclosure, a light emitting display apparatus includes a substrate including a first area and a second area; an insulating layer disposed on the substrate and having an uneven surface; a first bank on the insulating layer in the second area and formed of a black material; a first electrode on the insulating layer in the first area, the first electrode covering at least a part of a side surface of the first bank; a light emitting layer on the first electrode; and a second electrode on the light emitting layer. Accordingly, the light emitted from the light emitting layer which can be absorbed by the first bank is emitted to the outside to improve the optical efficiency.

According to another aspect of the present disclosure, a light emitting display apparatus includes a substrate; an over coating layer having a plurality of convex portions or a plurality of concave portions on the substrate; a light emitting device on the over coating layer, the light emitting device including a light emitting layer, a first electrode between the light emitting layer and the over coating layer to be configured to upwardly reflect light emitted from the light emitting layer to improve an light extraction efficiency, and a second electrode on the light emitting layer; and a black bank between the over coating layer and the light emitting device and configured to reduce the degradation of a contrast ratio due to scattered reflection by the plurality of convex portions or the plurality of concave portions, wherein the first electrode covers a part of the black bank to reduce the degradation of the light extraction efficiency caused when the light emitted from the light emitting layer is absorbed by the black bank. Therefore, the light extraction efficiency of the light emitting display apparatus can be improved and the outdoor visibility and the contrast ratio can be improved.

According to another aspect of the present disclosure, a light emitting display apparatus includes an over coating layer on a substrate and having a plurality of convex portions or a plurality of concave portions, a light emitting device disposed on the over coating layer and including a light emitting layer, a first electrode between the light emitting layer and the over coating layer, and a second electrode on the light emitting layer, and a black bank d between the over coating layer and the light emitting device and the first electrode covers a part of the black bank. Therefore, the optical efficiency can be improved and the degradation of the outdoor visibility in accordance with the external light reflection can be improved.

Other detailed matters of the embodiments are included in the detailed description and the drawings.

According to the present disclosure, the surface plasmon loss by which the light is absorbed onto the light emitting layer and the metal surface of the light emitting display apparatus, is improved to improve the optical efficiency.

According to the present disclosure, the black luminance of the light emitting display apparatus is improved so that the outdoor visibility degradation and the contrast ratio degradation can be reduced or prevented.

Further, according to the present disclosure, a lower electrode of the light emitting device is disposed to extend to a side of a black bank to emit the light, which is incident onto the black bank, to the outside, thereby improving the luminance.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
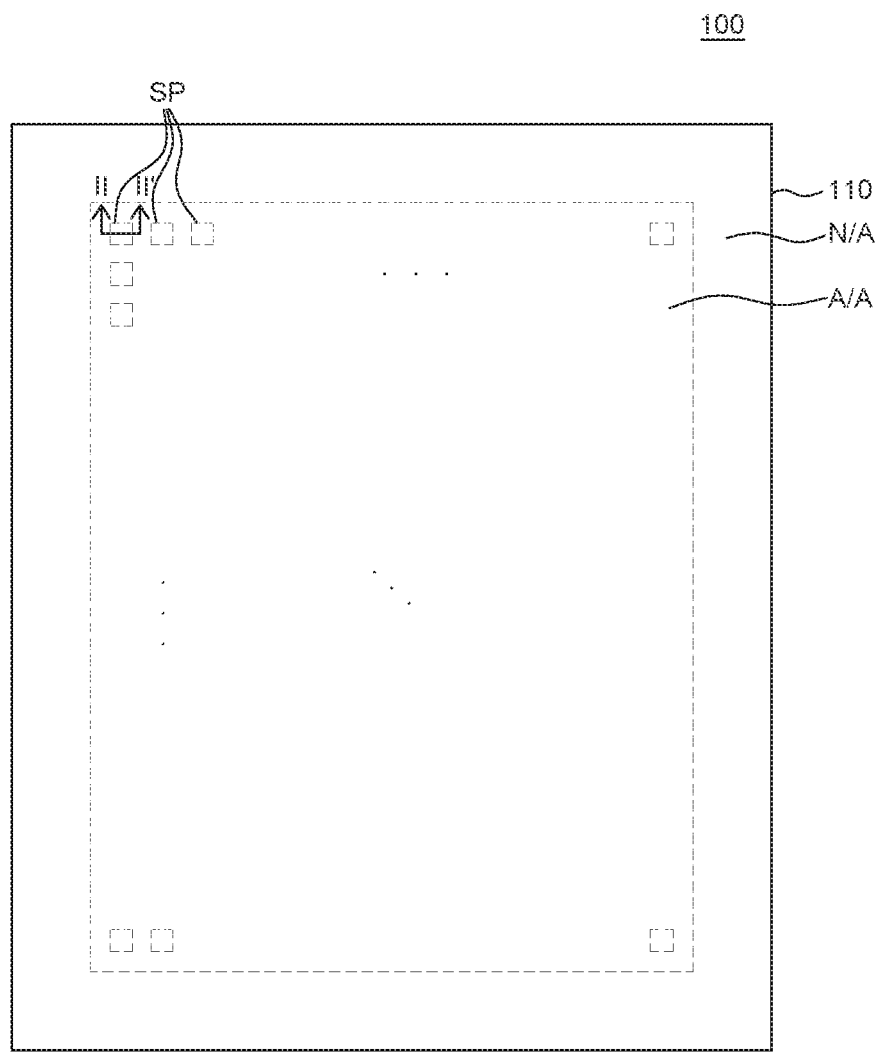
FIG. 1 illustrates a light emitting display apparatus according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "include," "have," "comprise" used herein are generally intended to allow other components to be added unless the terms are used with the term "only." Any references to singular can include plural unless expressly stated otherwise.

Components are interpreted to include an ordinary error range even if not expressly stated.

When the position relation between two parts is described using the terms such as "on," "above," "below," and "next," one or more parts can be positioned between the two parts unless the terms are used with the term "immediately" or "directly."

When an element or layer is disposed "on" another element or layer, another layer or another element can be interposed directly on the other element or therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

Figure 2:
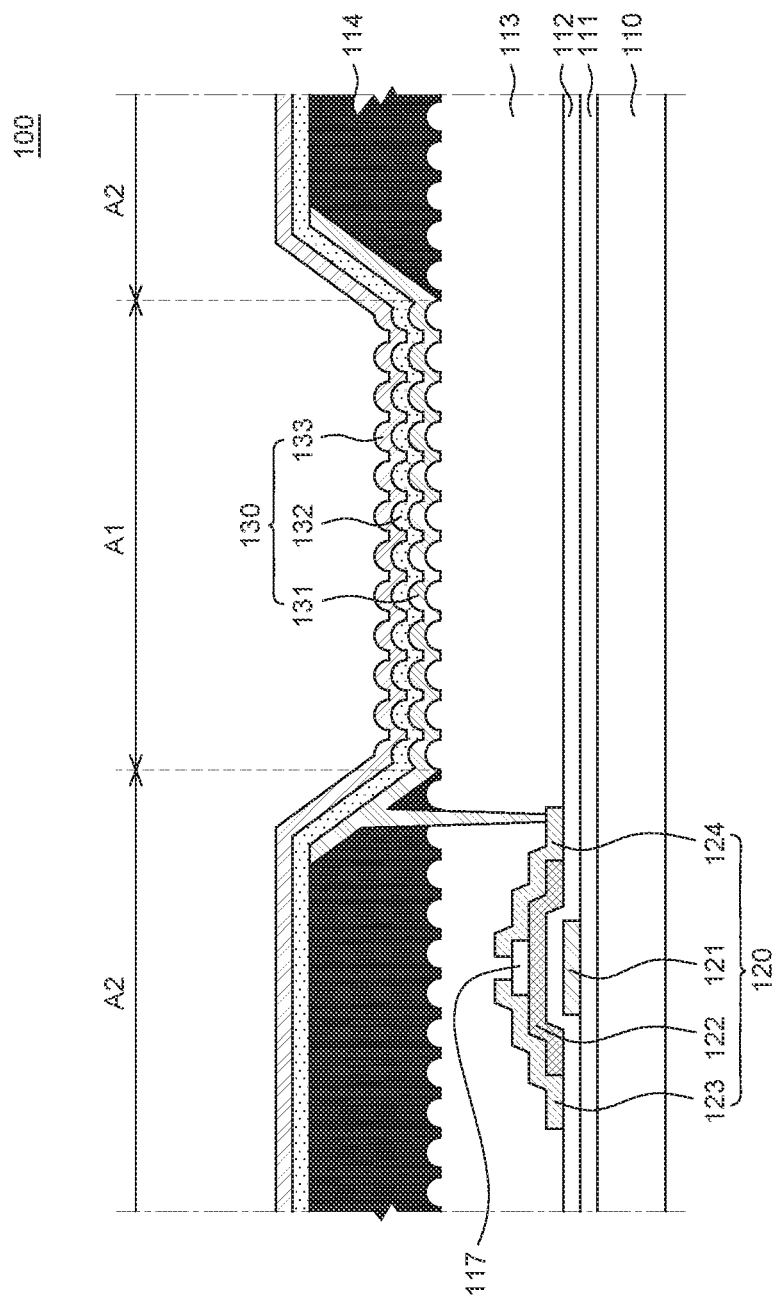
FIG. 2 is a cross-sectional view of a light emitting display apparatus taken along line II-II' of FIG. 1.

FIG. 1 illustrates a light emitting display apparatus according to an embodiment of the present disclosure. FIG. 2 is a cross-sectional view of a light emitting display apparatus taken along line II-II' of FIG. 1. All components of the light emitting display apparatus according to all embodiments of the present disclosure are operatively coupled and configured.

With reference to FIGS. 1 and 2, a light emitting display apparatus 100 includes a substrate 110, a thin film transistor 120, a light emitting device 130, and a first bank 114.

With reference to FIGS. 1 and 2, the substrate 110 is a substrate which supports and protects several components of the light emitting display apparatus 100. The substrate 110 can be formed of a glass, or a plastic material having flexibility. When the substrate 110 is formed of a plastic material, for example, the substrate can be formed of polyimide (PI). But, it is not limited thereto and other variations are possible.

The substrate 110 includes a display area AA and a non-display area NA.

The display area AA is an area in which an image is displayed in the light emitting display apparatus 100 and a display element and various driving elements for driving the display element are disposed in the display area AA. For example, the display element can be configured by a light emitting device 130 including a first electrode 131, a light emitting layer 132, and a second electrode 133. Further, various driving elements for driving the display element, such as a thin film transistor 120, a capacitor, or a line can be disposed in the display area AA.

A plurality of sub pixels SP can be in the display area AA. The sub pixel SP is a minimum unit which configures a screen and each of the plurality of sub pixels SP can include a light emitting device 130 and a driving circuit for driving the corresponding light emitting device 130. Further, the plurality of sub pixels SP can emit light having different wavelengths. For example, the plurality of sub pixels SP can include a red sub pixel, a green sub pixel, and a blue sub pixel. But, it is not limited thereto and the plurality of sub pixels SP can further include a white sub pixel, or can have different color configurations.

The driving circuit of the sub pixel SP is a circuit for controlling the driving of the corresponding light emitting device 130. For example, the driving circuit can be configured to include the thin film transistor 120 and the capacitor, but is not limited thereto and other variations are possible.

The non-display area NA is an area where no image is displayed and various components for driving the plurality of sub pixels SP disposed in the display area AA can be disposed in the non-display area NA. For example, a driving IC which supplies a signal for driving the plurality of sub pixels SP and a flexible film, etc. can be disposed.

The non-display area NA can be an area which encloses the display area AA as illustrated in FIG. 1, but is not limited thereto and other variations are possible. For example, the non-display area NA can be an area extending from the display area AA. Further, a portion of the non-display area NA can be folded.

With reference to FIG. 2, a buffer layer 111 is disposed on the substrate 110. The buffer layer 111 can improve adhesiveness between layers on the buffer layer 111 and the substrate 110 and prevent alkali components, etc. leaked from the substrate 110. The buffer layer 111 can be formed of a single layer of silicon nitride SiNx or silicon oxide SiOx or a multiple layer of silicon nitride SiNx and silicon oxide SiOx, but is not limited thereto and other variations are possible. The buffer layer 111 is not an essential component and can be omitted based on a type or a material of the substrate 110, and a structure and a type of the thin film transistor 120.

With reference to FIG. 2, the thin film transistor 120 is disposed on the substrate 110. The thin film transistor 120 can be used as a driving element of the light emitting display apparatus 100. The thin film transistor 120 includes a gate electrode 121, an active layer 122, a source electrode 123, and a drain electrode 124. In the light emitting display apparatus 100 according to the embodiment of the present disclosure, the thin film transistor 120 has a structure in which the active layer 122 is disposed on the gate electrode 121 and the source electrode 123 and the drain electrode 124 are disposed on the active layer 122. Therefore, the thin film transistor 120 has a bottom gate structure in which the gate electrode 121 is disposed in the lowermost portion, but is not limited thereto and other variations are possible.

With reference to FIG. 2, the gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto and other variations are possible.

With reference to FIG. 2, a gate insulating layer 112 is disposed on the gate electrode 121. The gate insulating layer 112 is a layer for electrically insulating the gate electrode 121 from the active layer 122 and can be formed of an insulating material. For example, the gate insulating layer 112 can be formed as a single layer of silicon nitride (SiNx) or silicon oxide (SiOx) which is an inorganic material or a multiple layer of silicon nitride (SiNx) or silicon oxide (SiOx), but it is not limited thereto and other variations are possible.

With reference to FIG. 2, the active layer 122 is disposed on the gate insulating layer 112. The active layer 122 is disposed so as to overlap the gate electrode 121. For example, the active layer can be formed of an oxide semiconductor or amorphous silicon (a-Si), polycrystalline silicon (poly-Si), or an organic semiconductor.

With reference to FIG. 2, an etch stopper 117 is disposed on the active layer 122. The etch stopper 117 can be a layer formed to prevent or suppress the damage of the surface of the active layer 122 due to the plasma when the source electrode 123 and the drain electrode 124 are patterned using an etching method. A portion of the etch stopper 117 overlaps the source electrode 123 and the other portion overlaps the drain electrode 124. However, the etch stopper 117 can be omitted.

With reference to FIG. 2, the source electrode 123 and the drain electrode 124 are disposed on the active layer 122 and the etch stopper 117. The source electrode 123 and the drain electrode 124 are disposed on the same layer to be spaced apart from each other. The source electrode 123 and the drain electrode 124 can be in contact with the active layer 122 to be electrically connected to the active layer 122. The source electrode 123 and the drain electrode 124 can be any one of various metal materials, for example, any one of molybdenum (Mo), aluminum (Al), chrome (Cr), gold (Au), titanium (Ti), nickel (Ni), neodymium (Nd), and copper (Cu)

or an alloy of two or more of them, or a multiple layer thereof, but it is not limited thereto and other variations are possible.

With reference to FIG. 2, an over coating layer 113 is disposed on the thin film transistor 120. The over coating layer 113 is an insulating layer which protects the thin film transistor 120 and makes the step of layers disposed on the substrate 110 gentle. The over coating layer 113 can be formed of one or more of acrylic-based resin, epoxy resin, phenol resin, polyamide-based resin, polyimide-based resin, unsaturated polyester-based resin, polyphenylene-based resin, polyphenylene sulfide-based resin, benzocyclobutene, and photoresist, but is not limited thereto and other variations are possible.

The over coating layer 113 includes a plurality of convex portions. Therefore, an upper surface of the over coating layer 113 can have an uneven shape. The convex portions of the over coating layer 113 can be formed, for example, using a mask process, but is not limited thereto and other variations are possible.

As illustrated in FIG. 2, the plurality of convex portions of the over coating layer 113 is formed on the entire upper surface of the over coating layer 113, but it is not limited thereto and other variations are possible. For example, the over coating layer 113 can be formed only in an area corresponding to a portion where the light emitting device 130 is formed, excluding a portion where a first bank 114 is formed. In this case, the upper surface of the over coating layer 113 corresponding to the portion where the first bank 114 is formed can be flat.

Even though in FIG. 2, it is illustrated that the over coating layer 113 includes a plurality of convex portions, the over coating layer 113 can include a plurality of concave portions or a combination of concave and convex portions. For example, the over coating layer 113 can have a plurality of convex portions and/or a plurality of concave portions. Further, even though in FIG. 2, it is illustrated that the plurality of convex portions of the over coating layer 113 has a hemispherical shape, the plurality of convex portions can have a semi-ellipsoidal shape, a pyramidal shape or other various shapes.

With reference to FIG. 2, the first bank 114 is disposed on the over coating layer 113. The first bank 114 is defined to be disposed in a second area A2 of the substrate 110 on the over coating layer 113. Here, the first area A1 of the substrate 110 is an area where the first bank 114 is not disposed and the light emitting device 130 and the over coating layer 113 are in contact with each other. The second area A2 of the substrate 110 is an area where the first bank 114 is disposed and the first bank 114 and the over coating layer 113 are in contact with each other. Therefore, as the first bank 114 is disposed on the over coating layer 113 in the second area A2, the first bank 114 covers the plurality of convex portions of the over coating layer 113 to planarize the second area A2.

The first bank 114 can be formed of an organic material. For example, the first bank 114 can be formed of polyimide-based, acrylic-based, or benzocyclobutene-based resin, but is not limited thereto and other variations are possible.

Further, the first bank 114 can be formed of a black material. For example, the first bank 114 is configured such that the black pigment is dispersed in an organic material. However, as long as the first bank has a black color, the first bank can be configured by an arbitrary material. For example, the organic material can be cardo-based polymer and polymer including epoxy acrylate, but is not limited thereto and other variations are possible.

As the first bank 114 includes the black material, the first bank 114 can reduce external light reflection, for example, scattered reflection which can be generated by an uneven upper surface of the over coating layer 113. For example, in order to reduce the reflection of external light, an optical density of the first bank 114 can be 4 or lower at the thickness of 3 μm of the first bank 114, but is not limited thereto and other variations are possible. Further, in order to reduce the reflection of the external light, the reflectance of the first bank 114 can be 1% or lower, but is not limited thereto and other variations are possible.

With reference to FIG. 2, the light emitting device 130 is disposed on the over coating layer 113 and the first bank 114. The light emitting device 130 includes the first electrode 131 which is electrically connected to the drain electrode 124 of the thin film transistor 120 (e.g., via a contact hole), the light emitting layer 132 disposed on the first electrode 131, and the second electrode 133 disposed on the light emitting layer 132.

The first electrode 131 is disposed on the over coating layer 113 and the first bank 114. For example, the first electrode 131 is disposed on the over coating layer 113 in the first area A1 and disposed on the first bank 114 in the second area A2. The first electrode 131 can be disposed to cover an inclined side surface of the first bank 114 and an inclination angle of the side surface of the first bank can be 20 degrees to 80 degrees.

For example, as illustrated in FIG. 2, the first electrode 131 is disposed on the over coating layer 113 and disposed to extend to the side surface of the first bank 114. Even though in FIG. 2, it is illustrated that the first electrode 131 covers the entire side surface of the first bank 114, it is not limited thereto. For example, the first electrode 131 can cover a part or some portion of the side surface of the first bank 114. As described above, the first electrode 131 is disposed on the over coating layer 113 in the first area A1 and disposed on the first bank 114 in the second area A2 so that the first electrode 131 is electrically connected to the drain electrode 124 through contact holes in the over coating layer 113 and the first bank 114. However, it is not limited thereto and the first electrode 131 can be electrically connected to the source electrode 123.

The first electrode 131 can be formed of a metal material. Therefore, the first electrode 131 functions as a reflective layer. For example, the first electrode 131 can be formed of a metal material such as aluminum (Al), silver (Ag), copper (Cu), and magnesium-silver alloy (Mg:Ag), but is not limited thereto. As described above, as the first electrode 131 is formed of a metal material, the light emitting display apparatus 100 according to the embodiment of the present disclosure can be implemented as a top emission type light emitting display apparatus. For example, the light emitted from the light emitting layer 132 can be reflected from the first electrode 131 to be emitted to the outside through the second electrode 133.

As the first electrode 131 is disposed on the over coating layer 113 in the first area A1, the first electrode 131 can have an uneven shape on the over coating layer 113. For example, the first electrode 131 is disposed along the upper surface of the plurality of convex portions of the over coating layer 113 to have an uneven shape corresponding to the shape of the plurality of convex portions. Therefore, the surface plasmon loss is improved so that the light extraction efficiency can be improved.

The light emitting layer 132 is a layer for emitting light having a particular color and includes at least one of a red light emitting layer, a green light emitting layer, a blue light emitting layer, and a white light emitting layer, or includes other combinations of color layers. Further, the light emitting layer 132 can further include various layers such as a hole transporting layer, a hole injecting layer, an electron injecting layer, or an electron transporting layer. The light emitting layer 132 can be an organic light emitting layer formed of an organic material, but is not limited thereto. For example, the light emitting layer 132 can be a quantum dot light emitting layer or a micro LED.

The light emitting layer 132 is disposed on the first electrode 131 in the first area A1 and the second area A2. As the light emitting layer 132 is disposed on the first electrode 131 in the first area A1, the light emitting layer 132 can have an uneven shape on the first electrode 131 of the first area A1. For example, the light emitting layer 132 is disposed along the upper surface of the plurality of convex portions of the first electrode 131 to have an uneven shape corresponding to the shape of the plurality of convex portions. Further, the light emitting layer 132 can have a flat shape on the first electrode 131 in the second area A2.

The second electrode 133 is disposed on the light emitting layer 132. The second electrode 133 can be formed of a transparent conductive material to transmit light emitted from the light emitting layer 132. For example, the second electrode 133 can be formed of transparent conductive oxide such as indium tin oxide (ITO), indium zinc oxide (IZO), indium tin zinc oxide (ITZO), zinc oxide (ZnO), and tin oxide (TO), but is not limited thereto.

The second electrode 133 is disposed on the light emitting layer 132 in the first area A1 and the second area A2. As the second electrode 133 is disposed on the light emitting layer 132 in the first area A1, the second electrode 133 can have an uneven shape on the light emitting layer 132 of the first area A1. For example, the second electrode 133 is disposed along the upper surface of the plurality of convex portions of the light emitting layer 132 to have an uneven shape corresponding to the shape of the plurality of convex portions. Further, the second electrode 133 can have a flat shape on the light emitting layer 132 of the second area A2.

As the first electrode 131 is disposed on the side surface of the first bank 114, the light emitting device 130 can emit light not only from the first area A1, but also from a partial area or portion of the second area A2. For example, the light emitting device 130 emits light in an area where the first electrode 131, the light emitting layer 132, and the second electrode 133 are sequentially laminated or stacked. Further, the first electrode 131 is disposed on the side surface of the first bank 114 so that the light can also be emitted from the side surface of the first bank 114.

In the light emitting display apparatus 100 according to the embodiment of the present disclosure, the plurality of convex portions (and/or the plurality of concave portions) is formed on the over coating layer 113 so that the first electrode 131 is formed to have an uneven shape. Therefore, the light extraction efficiency of the light emitting device 130 can be improved. For example, an uneven structure is implemented on the surface of the first electrode 131 which reflects light emitted from the light emitting layer 132 to the second electrode 133 so that free electron vibration on the surface of the first electrode 131 is reduced or suppressed to improve the surface plasmon loss. Therefore, the amount of light extracted to the outside can be increased. Accordingly, the power consumption of the light emitting display apparatus 100 can be reduced.

Further, in the light emitting display apparatus 100 according to the embodiment of the present disclosure, as described above, the plurality of convex portions (and/or the plurality of concave portions) can be formed on the entire surface of the over coating layer 113. In this case, a separate mask process for partially forming the plurality of convex portions is unnecessary so that a process cost and a process time or tact time can be reduced.

In the meantime, in the light emitting display apparatus 100 according to the embodiment of the present disclosure, the micro cavity is implemented so that the light extraction efficiency can be improved by means of the constructive interference of light emitted from the light emitting layer 132. However, when the micro cavity is implemented, a problem in that the color sense difference is increased depending on a viewing angle may be caused. Therefore, in the light emitting display apparatus 100 according to the embodiment of the present disclosure, the first electrode 131 has an uneven shape so that light reflected from the first electrode 131 is scattered. As a result, the color sense difference depending on the viewing angle can be enhanced.

Further, in the light emitting display apparatus 100 according to the embodiment of the present disclosure, the first bank 114 formed of a black material is disposed on the over coating layer 113 in the second area A2 to reduce the scattering reflectance in an off-state. For example, when the light emitting display apparatus is in an off-state or displays a black image, if light is scattered too much from the plurality of convex portions of the over coating layer, the outdoor visibility can be lowered and the contrast ratio can be lowered. However, in the light emitting display apparatus 100 according to the embodiment of the present disclosure, the first bank 114 formed of the black material covers the plurality of convex portions of the over coating layer 113 disposed in the second area A2. Therefore, the scattering reflectance in the light emitting display apparatus 100 is reduced to improve the black luminance, thereby improving the outdoor visibility and reducing or suppressing the degradation of the contrast ratio effectively.

Further, in the light emitting display apparatus 100 according to the embodiment of the present disclosure, the first electrode 131 which is formed of a metal material to function as a reflective layer is disposed in at least a part of the side surface of the first bank 114 to reflect light which is incident into the first bank 114 toward the second electrode 133. In contrast, if the first electrode 131 is not disposed on the side surface of the first bank 114, then all the light which is emitted from the light emitting layer 132 to be incident into the first bank 114 will be absorbed by the first bank 114 so that the luminance of the light emitting display apparatus 100 can be reduced. Therefore, in the light emitting display apparatus 100 according to the embodiment of the present disclosure, the first electrode 131 which functions as a reflective layer is disposed so as to cover at least a part of the side surface of the first bank 114. As a result, the light which is emitted from the light emitting layer 132 to travel toward the first bank 114 is reflected by the first electrode 131 towards the second electrode and is then emitted to the outside through the second electrode 133. Therefore, in the light emitting display apparatus 100 according to the embodiment of the present disclosure, the light extraction efficiency and the luminance can be improved significantly.

Further, in the display apparatus according to the embodiment of the present disclosure, the light emitting device 130 can emit light not only in the first area A1, but also in the second area A2. That is, as the first electrode 131 is disposed on the side surface of the first bank 114 disposed in the second area A2, there can be an area where the first electrode 131, the light emitting layer 132, and the second electrode 133 are sequentially laminated or stacked. Therefore, in contrast to a general display apparatus, in the light emitting display apparatus 100 according to the embodiment of the present disclosure, the light emitting device 130 emits light also in the area where the first bank 114 is disposed, e.g., both in the first and second areas A1 and A2. Therefore, a size of the emission area can be increased and the luminance can be improved.

In some embodiments, the over coating layer 113 is formed to have a flat upper surface and a separate film having a plurality of convex portions (and/or concave portions) or a plurality of nano structures corresponding to the plurality of convex portions (and/or concave portions) is disposed on the upper surface of the over coating layer 113. Therefore, the first electrode 131 can have an uneven shape along the shape of the plurality of convex and/or concave portions of the separate film. Therefore, it is possible to implement the first electrode 131 to have an uneven shape without performing a separate mask process. Further, the process is simplified so that the process cost can be reduced and the increase of the process time or the tact time can be suppressed or reduced.

Figure 3:
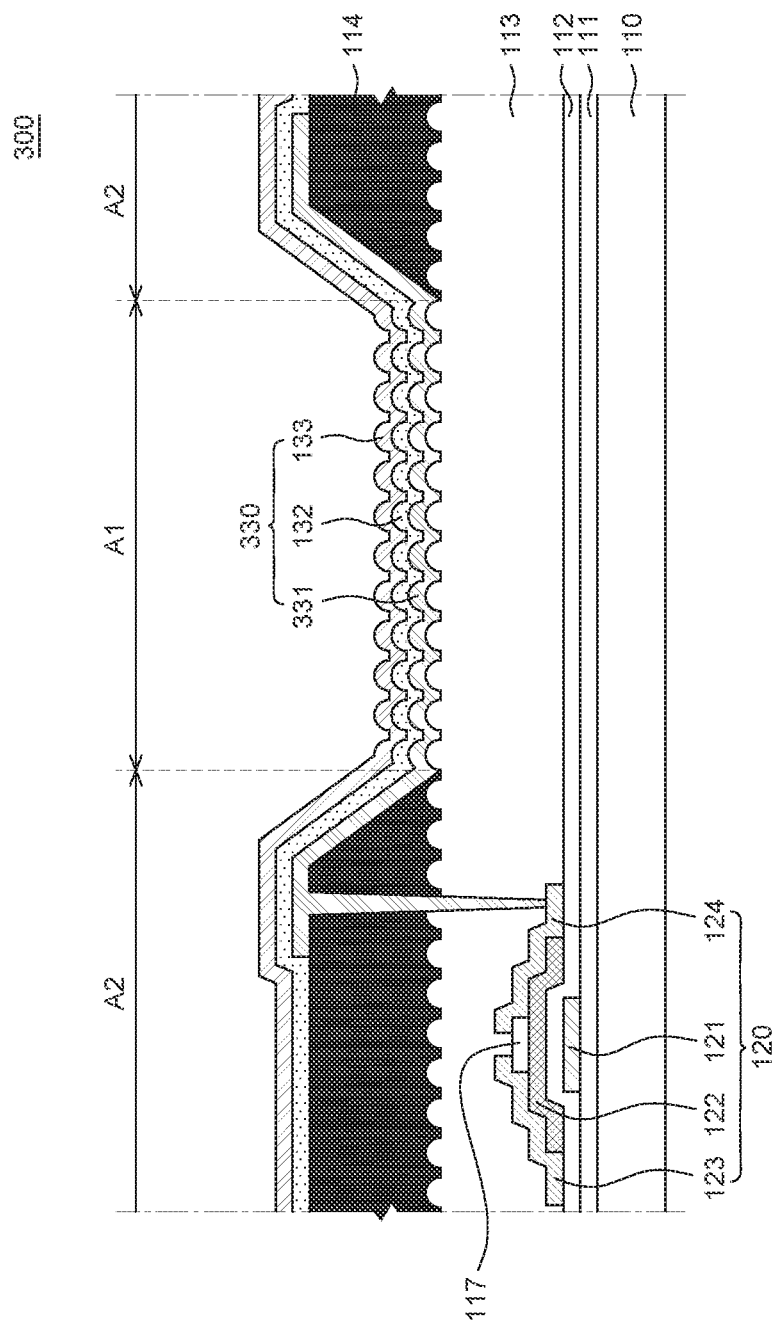
FIG. 3 is a cross-sectional view of a light emitting display apparatus according to another example of the present disclosure.

FIG. 3 is a cross-sectional view of a light emitting display apparatus according to another example of the present disclosure. That is, FIGS. 3-7 are cross-sectional views across a line cut through a sub-pixel of various light emitting display apparatuses, similar to line II-II' of FIG. 1.

As shown in FIG. 3, a first electrode 331 of a light emitting device 330 in a light emitting display apparatus 300 is different from that of the light emitting display apparatus 100 of FIGS. 1 and 2, but other configuration is substantially the same so that a redundant description will be omitted or will be brief.

With reference to FIG. 3, the first electrode 331 is disposed on the over coating layer 113 and the first bank 114. For example, the first electrode 331 is disposed on the over coating layer 113 in the first area A1 and disposed on the first bank 114 in the second area A2. In this case, the first electrode 331 can be disposed to cover the entire side surface of the first bank 114 and a part or some portion of the upper surface of the first bank 114. For example, as illustrated in FIG. 3, the first electrode 331 is disposed on the over coating layer 113 and extends to the side surface of the first bank 114 to cover the entire side surface of the first bank 114. Further, the first electrode 331 extends to the upper (or top) surface of the first bank 114 to cover a part of the upper surface of the first bank 114.

As the first electrode 331 is disposed on the over coating layer 113 in the first area A1 and disposed on the first bank 114 in the second area A2, the first electrode 331 can be electrically connected to the drain electrode 124 through contact holes in the over coating layer 113 and the first bank 114. In this case, the contact hole in the first bank 114 can extend from the upper surface of the first bank 114. For example, as illustrated in FIG. 3, the drain electrode 124 of the thin film transistor 120 can be connected to the first electrode 331 disposed on the upper surface of the first bank 114 through the contact hole formed in the first bank 114 and the over coating layer 113. For instance, the contact hole disposed through the first bank 114 extends from the top upper surface of the first bank 114 in FIG. 3, whereas the same contact hole in FIG. 2 extends from the side surface (slanted surface) of the first bank 114.

With reference to FIG. 3, as the first electrode 331 is disposed on the side surface and a part or portion of the upper surface of the first bank 114, the light emitting device 330 can emit light not only from the first area A1, but also from a part of the second area A2. For example, the light emitting device 330 emits light in an area where the first electrode 331, the light emitting layer 132, and the second electrode 133 are sequentially laminated or stacked. Further, the first electrode 331 is disposed on the side surface and a part or portion of the upper surface of the first bank 114 so that the light can also be emitted from the side surface and the part of the upper surface of the first bank 114.

In the light emitting display apparatus 300 according to the example of the present disclosure, the first electrode 331 which is formed of a metal material to function as a reflective layer is disposed on the side surface and the part of the upper surface of the first bank 114 to reflect light which is incident into the first bank 114 toward the second electrode 133. Therefore, the light which is emitted from the light emitting layer 132 to travel toward the first bank 114 is reflected by the first electrode 331 which functions as a reflective layer to be emitted to the outside. Therefore, the light extraction efficiency and the luminance can be improved.

Further, in the light emitting display apparatus according to this example of the present disclosure, the light emitting device 330 can emit light not only in the first area A1, but also in the second area A2. For example, as the first electrode 331 is disposed on the side surface and the part of the upper surface of the first bank 114 disposed in the second area A2, the light emitting device 330 emits light also in the second area A2 corresponding to the side surface and the part of the upper surface of the first bank 114. Therefore, the size of the emission area can be increased and the luminance can be improved.

Further, in the light emitting display apparatus 300 according to this example of the present disclosure, a part of the first electrode 331 disposed on the upper surface of the first bank 114 can be connected to the drain electrode 124 of the thin film transistor 120. For example, the first electrode 331 extends to a partial area of the upper surface of the first bank 114 and the contact hole for connecting the first electrode 331 and the drain electrode 124 extends from the upper surface (e.g., top surface adjacent to the slanted side surface) of the first bank 114. Therefore, in the light emitting display apparatus 300 according to this example of the present disclosure, the contact hole for connecting the first electrode 331 and the drain electrode 124 is formed from an even upper surface of the first bank 114. Therefore, the contact hole can be more stably formed and the electrical connection between the first electrode 331 and the drain electrode 124 can be smoothly implemented.

Figure 4:
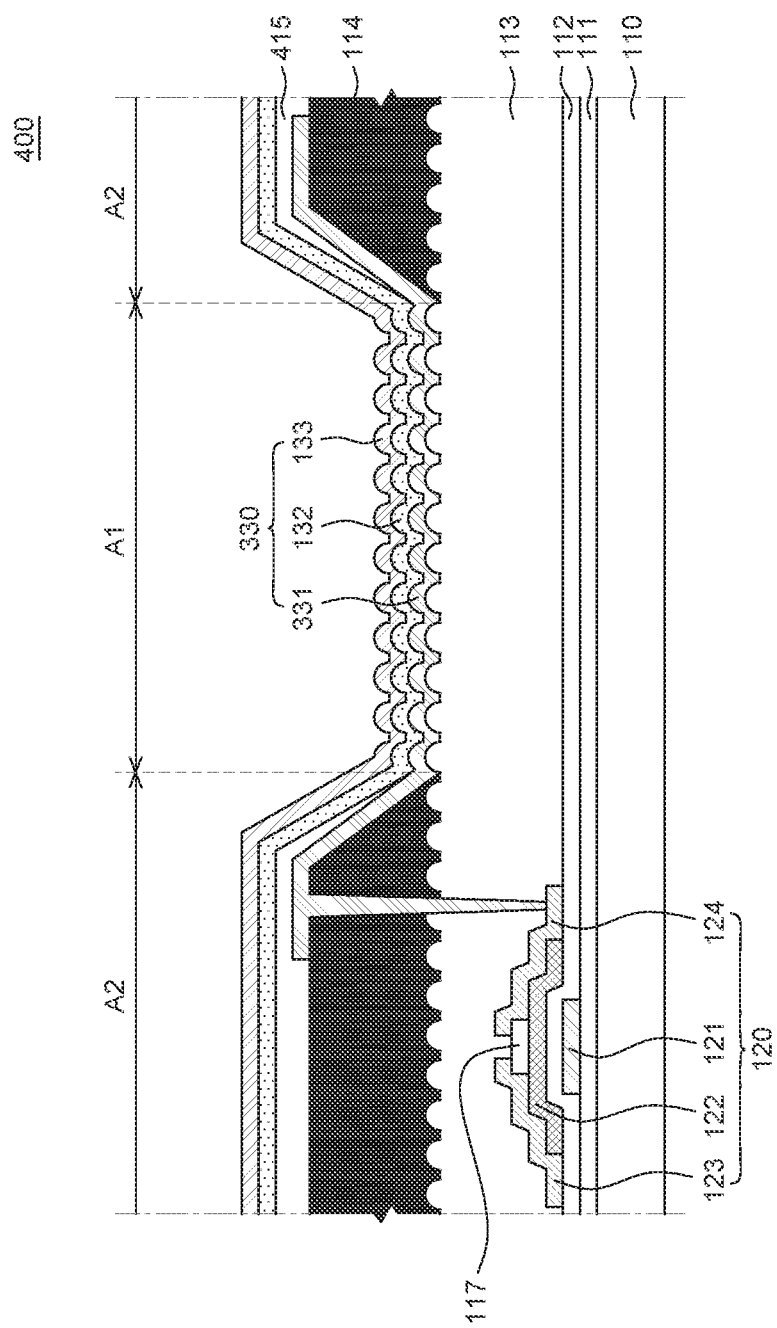
FIG. 4 is a cross-sectional view of a light emitting display apparatus according to another example of the present disclosure.

FIG. 4 is a cross-sectional view of a light emitting display apparatus according to another example of the present disclosure. A light emitting display apparatus 400 of FIG. 4 is different from the light emitting display apparatus 300 of FIG. 3 in that a second bank 415 is added, but other configuration is substantially the same so that a redundant description will be omitted or will be brief.

With reference to FIG. 4, the first electrode 331 is formed on a side surface and a part or portion of an upper surface of the first bank 114, and a second bank 415 is disposed to cover the first electrode 331 and the first bank 114. In this case, as illustrated in FIG. 4, the second bank 415 can cover the first bank 114 and the first electrode 331 in the second area A2, but is not limited thereto. For example, in some embodiments, the second bank 415 can be disposed in a partial area of the first area A1 and can be disposed not in the entire second area A2, but in a part of the second area A2.

The second bank 415 can be formed of a transparent material. As described above, the first electrode 331 functions as a reflective layer to reflect light, which is emitted from the light emitting layer 132 to be incident into the first bank 114, toward the second electrode 133. If the second bank 415 were to be formed of an opaque material, the second bank 415 absorbs light, similarly to the first bank 114. Therefore, the second bank 415 can be formed of a transparent insulating material. For example, the second bank 415 can be formed of polyimide-based, acrylic-based, or benzocyclobutene based resin, but is not limited thereto.

With reference to FIG. 4, the light emitting layer 132 and the second electrode 133 are sequentially disposed on the first bank 114 and the first electrode 331. For example, in the first area A1, the light emitting layer 132 and the second electrode 133 are disposed on the first electrode 331. In the second area A2, the light emitting layer 132 and the second electrode 133 are disposed on the second bank 415. Therefore, the light emitting device 330 can emit light only in the first area A1 where the first electrode 331, the light emitting layer 132, and the second electrode 133 are sequentially laminated or stacked. The light which is emitted from the light emitting layer 132 by the first electrode 331 disposed in the second area A2 is emitted toward the second electrode 133 so that an actual emission area can be larger than the first area A1.

In the light emitting display apparatus 400 according to this example of the present disclosure, a short-circuit phenomenon between the first electrode 331 and the second electrode 133 can be reduced or suppressed by the second bank 415 between the first electrode 331 and the light emitting layer 132 on the side surface of the first bank 114.

As illustrated in FIG. 4, the side surface of the first bank 114 is inclined and the first electrode 331 is formed along the shape of the side surface of the first bank 114 so that an upper surface of the first electrode 331 on the side surface of the first bank 114 is also inclined. Therefore, the light emitting layer 132 is formed on the inclined first electrode 331. However, if the light emitting layer is formed on an inclined surface using a deposition process, the light emitting layer can be formed to be too thin or cracked. Therefore, in the light emitting display apparatus 400 according to this example of the present disclosure, in the second area A2, for example, in an area where the first electrode 331 is formed to be inclined, the second bank 415 is disposed so that the short-circuit between the first electrode 331 and the second electrode 133 can be reduced or suppressed. Therefore, the reliability of the light emitting device 330 can be improved.

Figure 5:
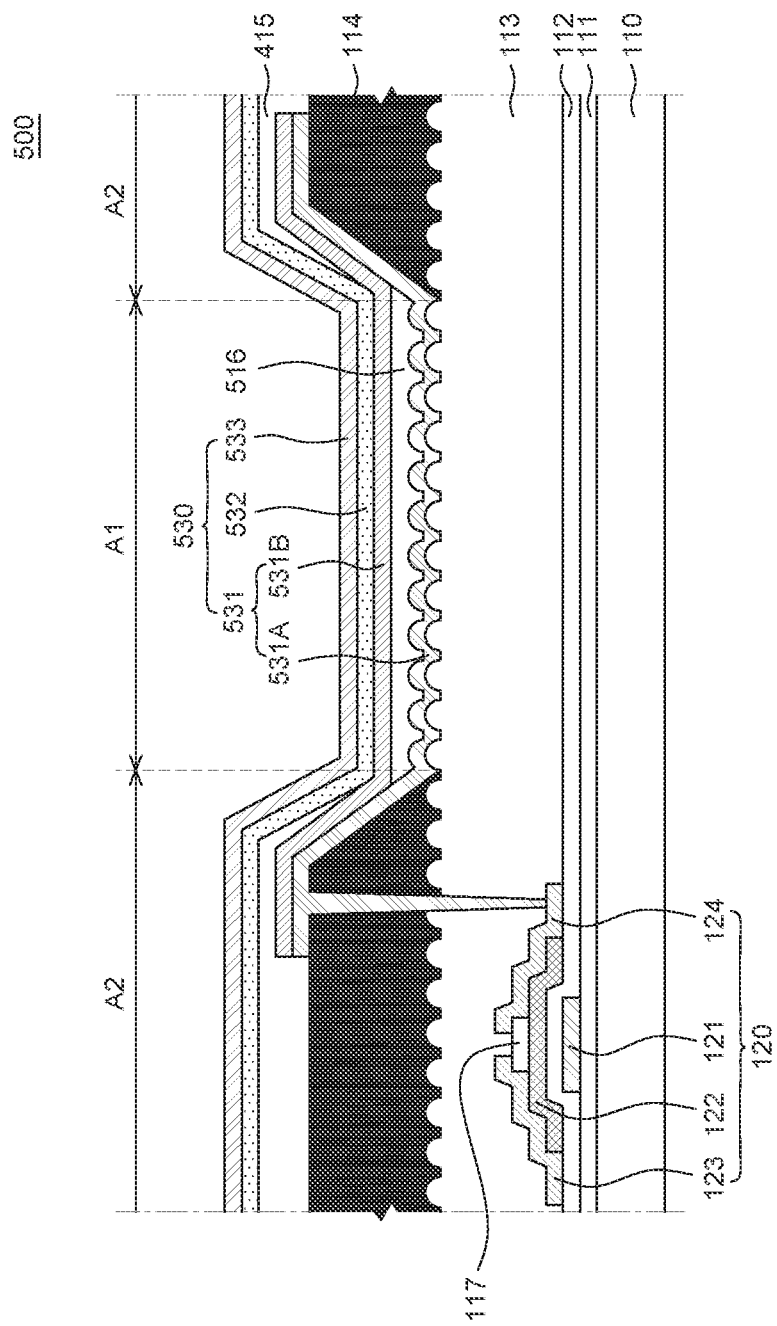
FIG. 5 is a cross-sectional view of a light emitting display apparatus according to another example of the present disclosure.

FIG. 5 is a cross-sectional view of a light emitting display apparatus according to another example of the present disclosure. A light emitting display apparatus 500 of FIG. 5 is different from the light emitting display apparatus 400 of FIG. 4 in that a light emitting device 530 is different and a planarization layer 516 is added, but other configuration is substantially the same so that a redundant description will be omitted or will be brief.

With reference to FIG. 5, the light emitting device 530 is disposed on the over coating layer 113 and the first bank 114. The light emitting device 530 includes a first electrode 531 which is electrically connected to the drain electrode 124 of the thin film transistor 120, a light emitting layer 532 disposed on the first electrode 531, and a second electrode 533 formed on the light emitting layer 532.

The first electrode 531 is disposed on the over coating layer 113 and the first bank 114. For example, the first electrode 531 is disposed on the over coating layer 113 in the first area A1 and disposed on the first bank 114 in the second area A2. In this case, the first electrode 531 can be disposed to cover the side of the first bank 114 and a part of the upper surface thereof.

The first electrode 531 includes a reflective layer 531A disposed on the over coating layer 113 and the first bank 114 and a transparent conductive layer 531B disposed on the reflective layer 531A.

The reflective layer 531A can be formed of a metal material. For example, the reflective layer 531A can be formed of a metal material such as aluminum (Al), silver (Ag), or copper (Cu), but is not limited thereto. As described above, the reflective layer 531A is formed of a metal material so that the light emitting display apparatus 500 according to this example of the present disclosure can be implemented as a top emission type light emitting display apparatus.

As the reflective layer 531A is disposed on the over coating layer 113 in the first area A1, the reflective layer 531A can have an uneven shape on the over coating layer 113. For example, the reflective layer 531A is disposed along the upper surface of the plurality of convex portions of the over coating layer 113 to have an uneven shape corresponding to the shape of the plurality of convex portions of the over coating layer 113. Therefore, the surface plasmon loss is improved so that the light extraction efficiency can be improved.

With reference to FIG. 5, the planarization layer 516 is disposed on the reflective layer 531A. The planarization layer 516 can be an insulating layer for planarizing a surface on which the light emitting layer 532 and the second electrode 533 are formed. For example, even though the reflective layer 531A which is disposed below the planarization layer 516 has an uneven shape, the planarization layer 516 is disposed so that the light emitting layer 532 and the second electrode 533 can be disposed on a flat surface on the planarization layer 516. The planarization layer 516 needs to cover the plurality of convex portions of the reflective layer 531A disposed therebelow so that the planarization layer 516 can be formed to be thicker than a height of the plurality of convex portions of the reflective layer 531A.

The planarization layer 516 can be formed of a transparent organic material. For example, the planarization layer 516 can be formed of a material which does not outgas during the process of manufacturing the light emitting device 530 or after manufacturing the light emitting device 530. For example, the planarization layer 516 can be a transparent material which does not outgas so that light reflected during the vapor deposition passes therethrough. For example, the planarization layer 516 can be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene, and photoresist, but is not limited thereto. Further, the planarization layer 516 can be formed of the same material as the over coating layer 113.

With reference to FIG. 5, the transparent conductive layer 531B of the first electrode 531 is disposed on the reflective layer 531A of the first electrode 531 and the planarization layer 516. The transparent conductive layer 531B is in contact with the reflective layer 531A in the second area A2 where the planarization layer 516 is not disposed. Therefore, the transparent conductive layer 531B can be applied with a voltage from the drain electrode 124 of the thin film transistor 120 through the reflective layer 531A. For example, the transparent conductive layer 531B and the reflective layer 531A can have the same potential. For example, the transparent conductive layer 531B can be formed of transparent conductive oxide such as indium tin oxide (ITO), indium zinc oxide (IZO), indium tin zinc oxide (ITZO), zinc oxide (ZnO), and tin oxide (TO), but is not limited thereto.

As the transparent conductive layer 531B is disposed on the planarization layer 516, the transparent conductive layer 531B can have an even shape in an area where the light emitting layer 532 of the light emitting device 530 emits light. For example, as illustrated in FIG. 5, the reflective layer 531A has an uneven shape along the shape of the upper surface of the over coating layer 113, but the transparent conductive layer 531B can have a flat shape by the planarization layer 516 on the reflective layer 531A.

The light emitting layer 532 is formed on the first electrode 531 and the second bank 415. For example, as the light emitting layer 532 is disposed on the transparent conductive layer 531B of the first electrode 531, the light emitting layer 532 can have a flat shape on the first electrode 531 of the first area A1.

Further, the second electrode 533 is disposed on the light emitting layer 532. For example, as the second electrode 533 is disposed on the light emitting layer 532, the second electrode 533 can also have the flat shape on the first electrode 531 of the first area A1. The second electrode 533 can be formed of transparent conductive oxide such as indium tin oxide (ITO), indium zinc oxide (IZO), indium tin zinc oxide (ITZO), zinc oxide (ZnO), and tin oxide (TO) or a ytterbium (Yb) alloy, but is not limited thereto.

Alternatively, the second electrode 533 can be formed of a metal material such as silver (Ag), copper (Cu), and magnesium-silver alloy (Mg:Ag), but is not limited thereto.

In the light emitting display apparatus 500 according to this example of the present disclosure, the planarization layer 516 is disposed on the reflective layer 531A of the first electrode 531 having an uneven shape and the transparent conductive layer 531B of the first electrode 531 is formed on the planarization layer 516. Therefore, because the transparent conductive layer 531B of the first electrode 531, the light emitting layer 532, and the second electrode 533 of the light emitting device 530 are formed on the flat surface, an electrical injection characteristic of the light emitting device 530 can be uniformly implemented and the reliability of the light emitting device 530 can be improved.

Further, in the light emitting display apparatus 500 according to this example of the present disclosure, the planarization layer 516 is disposed on the reflective layer 531A of the first electrode 531 so that the scattering reflectance of the reflective layer 531A can be reduced. For example, when the light emitting display apparatus is in an off-state or displays a black image, if light is scattered too much from the light emitting device, the outdoor visibility can be lowered and the contrast ratio can be reduced. However, in the light emitting display apparatus 500 according to this example of the present disclosure, the planarization layer 516 is disposed between the reflective layer 531A and the transparent conductive layer 531B of the first electrode 531. Therefore, the scattering reflectance in the light emitting device 530 is reduced to improve the black luminance and improve the outdoor visibility and the contrast ratio.

Figure 6:
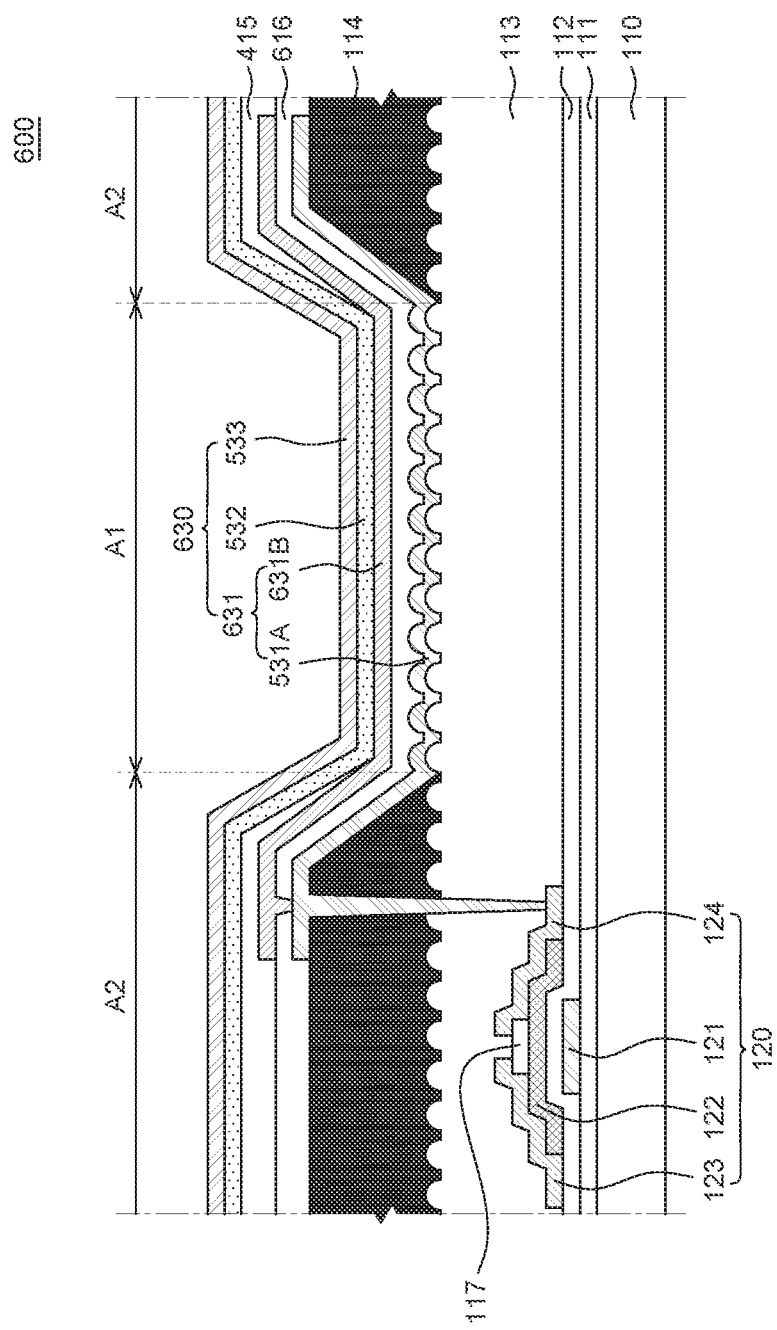
FIG. 6 is a cross-sectional view of a light emitting display apparatus according to another example of the present disclosure.

FIG. 6 is a cross-sectional view of a light emitting display apparatus according to another example of the present disclosure. A planarization layer 616 and a light emitting device 630 of a light emitting display apparatus 600 of FIG. 6 are different from those of the light emitting display apparatus 500 of FIG. 5, but other configuration is substantially the same so that a redundant description will be omitted or will be brief.

With reference to FIG. 6, the light emitting device 630 includes a first electrode 631, a light emitting layer 532 disposed on the first electrode 631, and a second electrode 533 disposed on the light emitting layer 532. The planarization layer 616 is disposed on the reflective layer 531A of the first electrode 631 and on a first bank 114. For example, the planarization layer 616 can be disposed in both the first area A1 and the second area A2, and for example, formed on the entire area of the display area AA. The planarization layer 616 can be an insulating layer for planarizing a surface on which the light emitting layer 532 and the second electrode 533 are formed and planarize an upper portion of the reflective layer 531A of the first electrode 631.

The reflective layer 531A and a transparent conductive layer 631B of the first electrode 631 can be electrically connected to each other through a contact hole in the planarization layer 616. As described above, as the planarization layer 616 is in both the first area A1 and the second area A2, the planarization layer 616 can cover the reflective layer 531A. Therefore, when the transparent conductive layer 631B is formed on the planarization layer 616, the reflective layer 531A and the transparent conductive layer 631B can be electrically insulated by the planarization layer 616. Therefore, as illustrated in FIG. 6, the transparent conductive layer 631B can be electrically connected to the reflective layer 531A through a contact hole in the planarization layer 616.

In the light emitting display apparatus 600 according to this example of the present disclosure, as described above, the plurality of convex portions is formed on the entire surface of the over coating layer 113. Therefore, a separate mask process for partially forming the plurality of convex portions is not necessary so that the process cost and the process time or the tact time can be reduced. Further, in the light emitting display apparatus 600 according to this example of the present disclosure, the planarization layer 616 is in the entire first area A1 and second area A2. Therefore, a separate mask process for partially forming the planarization layer 616 is not necessary so that the process cost and the process time or the tack time can be reduced.

Figure 7:
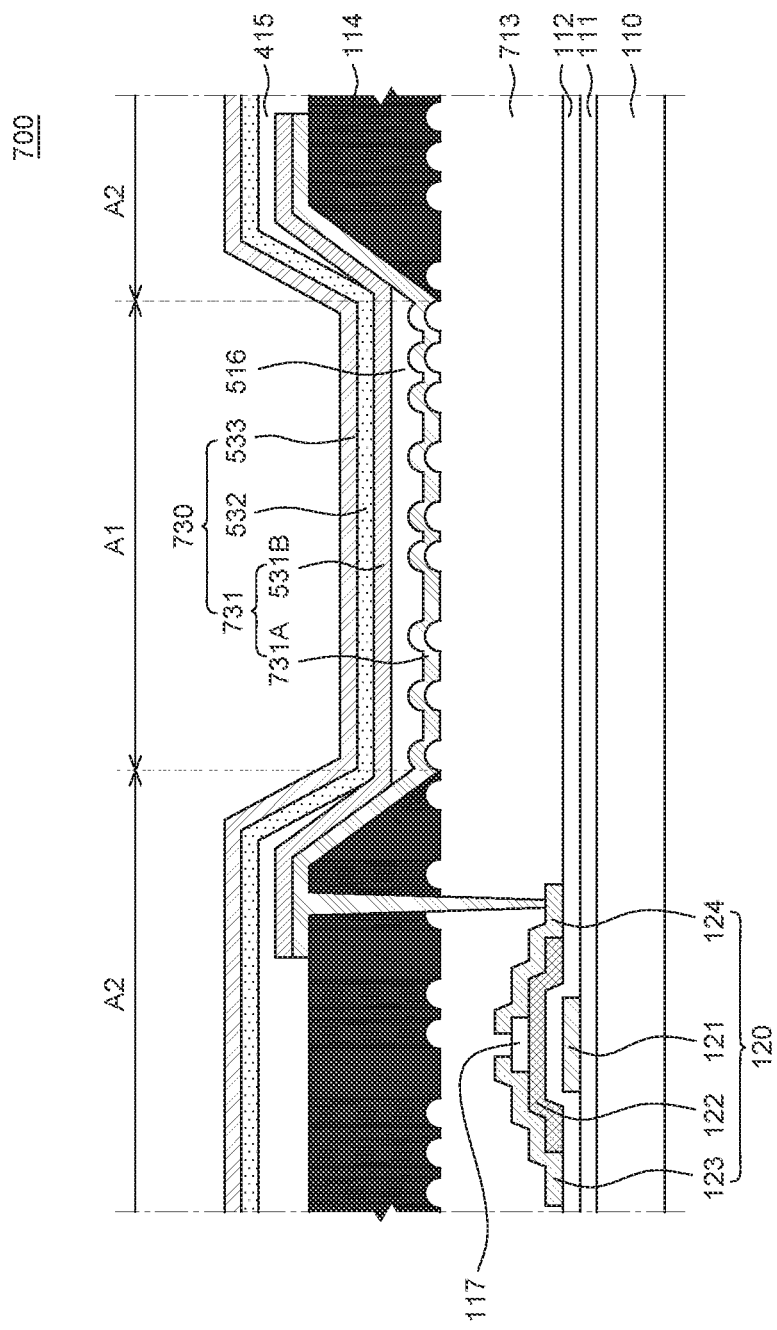
FIG. 7 is a cross-sectional view of a light emitting display apparatus according to another example of the present disclosure.

FIG. 7 is a cross-sectional view of a light emitting display apparatus according to another example of the present disclosure. A light emitting device 730 and an over coating layer 713 of a light emitting display apparatus 700 of FIG. 7 are different from those of the light emitting display apparatus 500 of FIG. 5, but other configuration is substantially the same so that a redundant description will be omitted or will be brief.

With reference to FIG. 7, the light emitting device 730 includes a first electrode 731, a light emitting layer 532 disposed on the first electrode 731, and a second electrode 533 disposed on the light emitting layer 532. The over coating layer 713 includes a plurality of convex portions which are aperiodically formed. For example, the plurality of convex portions of the over coating layer 713 is not formed to have a regular pattern but a density of the plurality of convex portions is high in some areas and a density of the plurality of convex portions is low in other areas. Further, distances between the plurality of convex portions can vary.

With reference to FIG. 7, a reflective layer 731A of the first electrode 731 is formed along the upper surface of the over coating layer 713 including the plurality of convex portions which are aperiodically formed. Therefore, the reflective layer 731A can have a plurality of aperiodic convex portions corresponding to the plurality of convex portions of the over coating layer 713. The transparent conductive layer 531B of the first electrode 731 is disposed on the planarization layer 516 and the reflective layer 731A.

Therefore, in the light emitting display apparatus 700 according to this example of the present disclosure, the plurality of aperiodic convex portions is formed on the over coating layer 713 and the reflective layer 731A so that the surface plasmon loss by which the light is absorbed by the light emitting layer 532 and the metal surface is improved to improve the luminous efficiency. Further, efficiency of light extracted to the outside of the light emitting device 730 is improved to reduce the power consumption and ensure the electrical stability of the light emitting device 730.

When the plurality of convex portions of the over coating layer is periodically formed so that the reflective layer also has a periodic convex-concave structure, constructive interference and destructive interference may be generated along a traveling direction of light which is reflected or transmitted from the reflective layer. As a result, a diffractive interference or moiré interference may be generated. In this case, there may be a problem in that the user or viewer visibly recognizes interference fringe or spot such as a wave pattern.

Therefore, in the light emitting display apparatus 700 according to this example of the present disclosure, the plurality of convex portions of the over coating layer 713 are aperiodically disposed so that the reflective layer 731A also has a plurality of irregular convex portions. Accordingly, the light emitting display apparatus 700 according to this example of the present disclosure can solve the problem in that a user visibly recognizes the interference pattern due to the diffractive interference or moiré interference of light.

In some embodiments, the over coating layer 713 can have an uneven upper surface on which fine wrinkle is formed. Such an over coating layer 713 is formed by a process of forming wrinkles in a hardening process during the exposure treatment, a process of forming wrinkles by performing a separate thermal treatment, or a process of removing a tensile stress after forming the over coating layer 713 in a state when the tensile stress is applied to the substrate 110, but is not limited thereto.

FIGS. 8A to 8D are graphs for explaining an optical efficiency of comparative examples and an example of the present disclosure. These graphs show examples of values for lumininance.

Figure 8A:
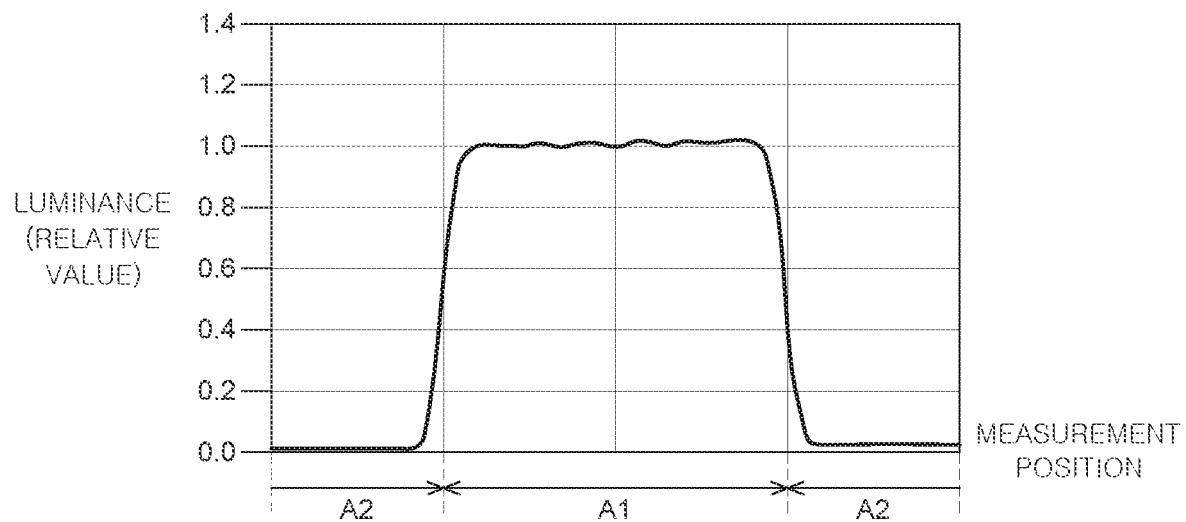
FIGS. 8A to 8D are graphs for explaining an optical efficiency of a comparative example and an embodiment of the present disclosure.
Figure 8B:
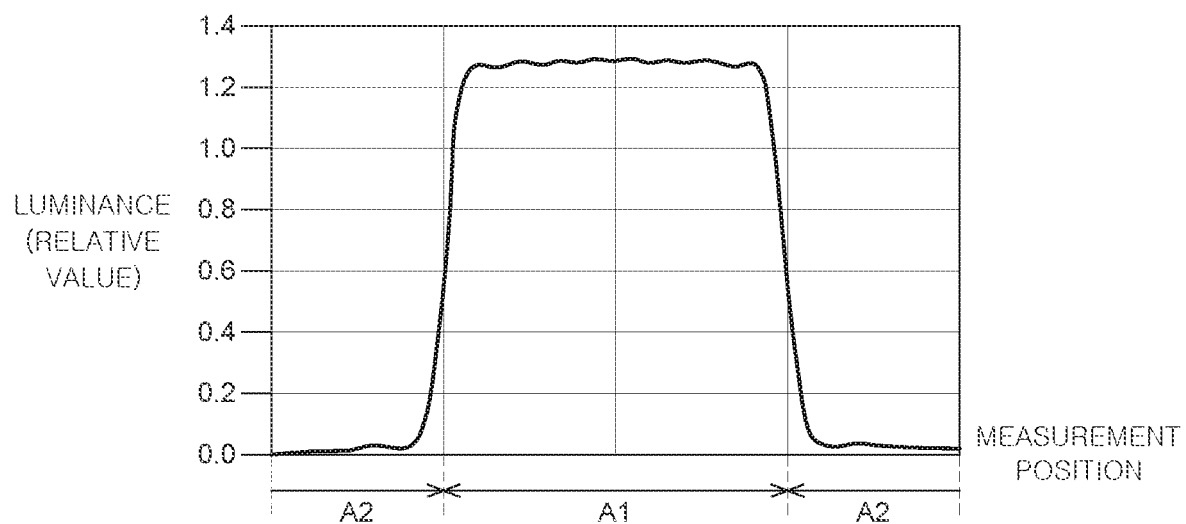
Figure 8C:
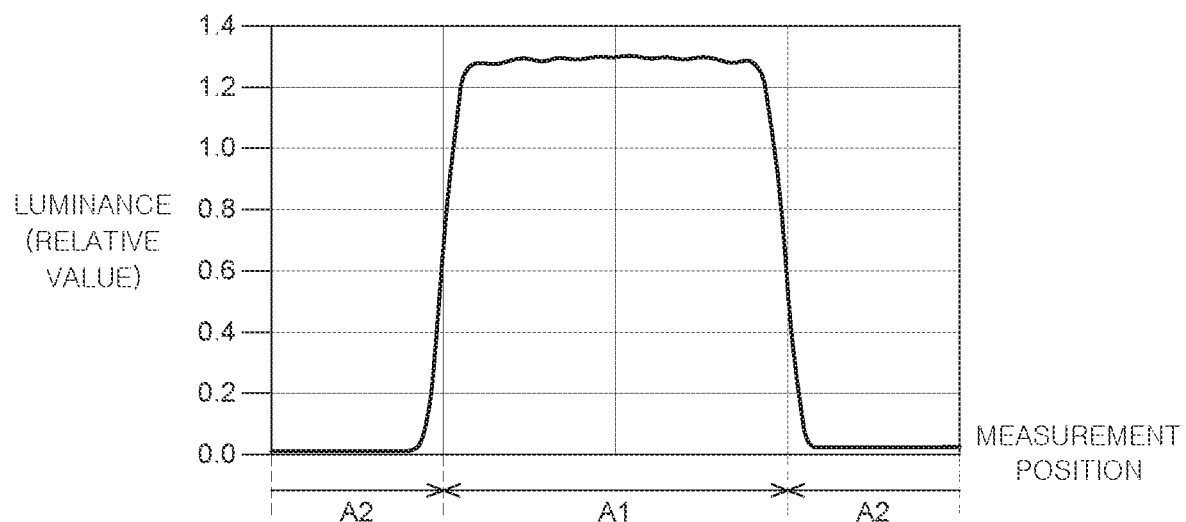
Figure 8D:
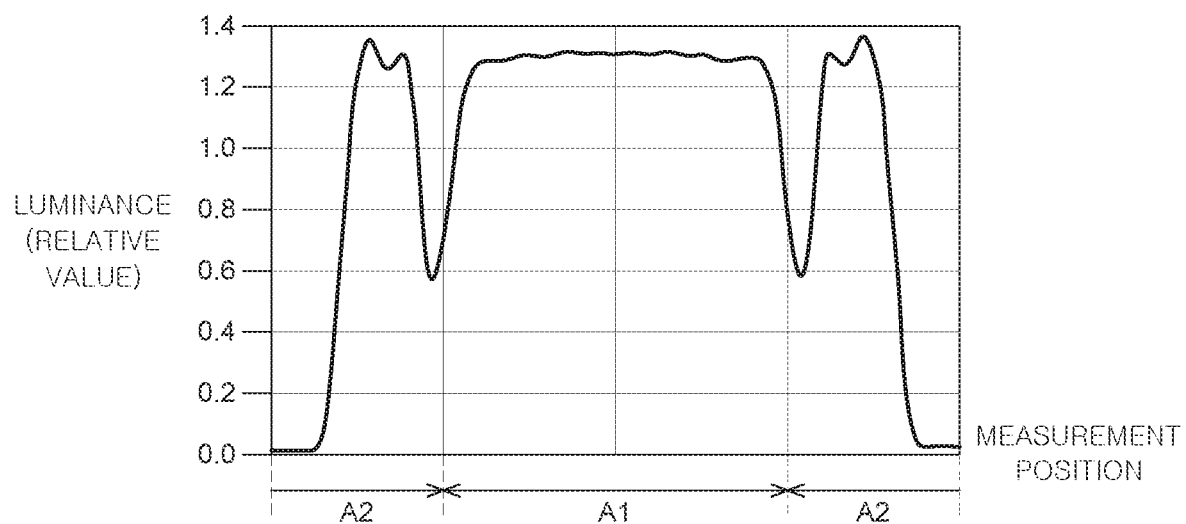

More specifically, FIG. 8A is a graph for explaining an optical efficiency for a comparative example 1, FIG. 8B is a graph for explaining an optical efficiency for a comparative example 2, FIG. 8C is a graph for explaining an optical efficiency for a comparative example 3, and FIG. 8D is a graph for explaining an optical efficiency of the light emitting display apparatus 400 illustrated in FIG. 4.

The comparative example 1 is a top emission type light emitting display apparatus in which a first electrode is disposed on a flat over coating layer, a transparent bank is disposed so as to cover the corner of the first electrode, and a light emitting layer and a second electrode are formed on the first electrode and the bank.

The comparative example 2 is a configuration obtained by adding a plurality of convex portions or a plurality of concave portions to the over coating layer in the comparative example 1, but still the bank is transparent.

The comparative example 3 is a configuration obtained by adding a black material to the bank in the comparative example 2. Although the details of the configurations of the comparison examples 1-3 are not provided, the configurations of the various examples of the present disclosure are different from the configurations of the comparison examples 1-3 since the examples of the present disclosure include a plurality of additional/different features as described above in reference to FIGS. 1-7.

In FIGS. 8A to 8D, an X-axis represents a position corresponding to the first area A1 and the second area A2 described with reference to FIGS. 1 to 7 as a luminance measurement position and a Y-axis represents a relative value of the luminance obtained by normalizing a luminance measured in the comparative example 1 as 1.00.

First, with reference to FIG. 8A, the comparative example 1 is a top emission type light emitting display apparatus in which a first area A1 where a bank is not disposed functions as an emission area. Therefore, as illustrated in FIG. 8A, the luminance is sharply changed at a boundary of the first area A1 and the second area A2 and a measured luminance value is assumed as 1.00.

Next, with reference to FIG. 8B, the comparative example 2 is a configuration obtained by adding a plurality of convex portions or a plurality of concave portions to the over coating layer in the comparative example 1. Therefore, it was confirmed that the luminance value in the first area A1 was increased as compared with the comparative example 1 and the relative value of the luminance in the comparative example 2 was measured as 1.35. However, as shown in FIG. 8B, external light is irregularly reflected by the plurality of convex portions or the plurality of concave portions of the over coating layer disposed below the bank so that a predetermined luminance value is measured also in the second area A2 in the comparative example 2, as compared with the comparative example 1. Therefore, in the comparative example 2, the outdoor visibility is lowered and the contrast ratio is lowered.

Next, with reference to FIG. 8C, the comparative example 3 is a configuration in which a black material is added to the bank in the comparative example 2. The black material is added to the bank so that the scattered reflection of the external light due to the plurality of convex portions or the plurality of concave portions of the over coating layer disposed below the bank cannot be caused. For example, all light which is incident onto or reflected from the plurality of convex portions or the plurality of concave portions of the over coating layer is absorbed by the bank. Therefore, as illustrated in FIG. 8C, the luminance value in the second area A2 can be substantially 0. However, in the comparative example 3, as the bank is formed of the black material, some of light emitted from the light emitting layer is absorbed by the bank so that the luminance loss can be generated. The relative value of the luminance in the comparative example 3 was measured as 1.28.

In contrast to FIGS. 8A-8C and with reference to FIG. 8D, in order to solve the luminance degradation generated in the comparative example 3, in the example of the present disclosure the first bank 114 including the black material is disposed on the over coating layer 113 and the first electrode 331 of the light emitting device 330 is disposed so as to cover the first bank 114. Therefore, the light which is emitted from the light emitting layer 132 of the light emitting device 330 to be absorbed by the first bank 114 is reflected by the first electrode 331 on the first bank 114 to be emitted. Therefore, as illustrated in FIG. 8D, in the second area A2 adjacent to the first area A1, that is, in a portion where the first electrode 331 is disposed, the luminance which is much higher than that of the comparative examples 1 to 3 is measured and the overall luminance of the light emitting display apparatus 400 can be increased. In detail, the relative value of the luminance in the example was measured as 2.80.

Accordingly, the embodiments and examples of the present disclosure can also be described as follows:

According to an aspect of the present disclosure, a light emitting display apparatus comprises a substrate including a first area and a second area; an insulating layer on the substrate and having an uneven surface; a first bank on the insulating layer in the second area and formed of a black material; a first electrode on the insulating layer in the first area, the first electrode covering at least a part of a side surface of the first bank; a light emitting layer on the first electrode; and a second electrode on the light emitting layer.

The insulating layer can include a plurality of convex portions or a plurality of concave portions in the first area and the second area, the first bank can cover the plurality of convex portions and/or the plurality of concave portions to planarize the second area, and the first electrode can be disposed along an upper surface of the plurality of convex portions and/or concave portions in the first area.

The plurality of convex portions and/or the plurality of concave portions of the insulating layer can be aperiodically disposed.

The first electrode can cover the entire side surface of the first bank and at least a part of an upper surface of the first bank extending from the side surface of the first bank.

The light emitting display apparatus can further comprise a thin film transistor on the substrate, wherein one of a source electrode and a drain electrode of the thin film transistor can be connected to the first electrode on the upper surface of the first bank.

The light emitting display apparatus can further comprise a second bank covering the first bank and the first electrode in the second area, and formed of a transparent material, wherein the light emitting layer and the second electrode can be disposed on the second bank.

The first electrode can include: i) a reflective layer, or ii) a reflective layer and a transparent conductive layer on the reflective layer.

The light emitting display apparatus can further comprise a planarization layer disposed between the reflective layer and the transparent conductive layer in the first area, wherein the reflective layer can be disposed along the uneven surface of the insulating layer.

The planarization layer can further extend over the first bank, the reflective layer and a thin film transistor in the second area.

The first and second area can be a part of a display area of the substrate.

According to another aspect of the present disclosure, a light emitting display apparatus comprises a substrate; an over coating layer having a plurality of convex portions or a plurality of concave portions on the substrate; a light emitting device on the over coating layer, the light emitting device including a light emitting layer, a first electrode between the light emitting layer and the over coating layer to be configured to upwardly reflect light emitted from the light emitting layer so as to improve an light extraction efficiency, and a second electrode on the light emitting layer; and a black bank between the over coating layer and the light emitting device, and configured to reduce a degradation of a contrast ratio due to scattered reflection by the plurality of convex portions or the plurality of concave portions, wherein the first electrode covers a part of the black bank so as to reduce a degradation of the light extraction efficiency caused when the light emitted from the light emitting layer is absorbed by the black bank.

The light emitting display apparatus can further comprise a second bank between the first electrode and the light emitting layer so as to reduce a short-circuit of the first electrode and the second electrode due to an inclined side surface of the black bank.

The first electrode can include a reflective layer on the over coating layer, and a transparent conductive layer on the reflective layer.

The light emitting display apparatus can further comprise a planarization layer providing a planarized upper surface between the reflective layer and the transparent conductive layer so as to reduce a scattering reflectance of the reflective layer.

The plurality of convex portions or the plurality of concave portions of the over coating layer can be aperiodically disposed so as to reduce moiré interference due to the plurality of convex portions or the plurality of concave portions.

According to another aspect of the present disclosure, a light emitting display apparatus comprises an over coating layer on a substrate, and having a plurality of convex portions or a plurality of concave portions; a light emitting device on the over coating layer, the light emitting device including a light emitting layer, a first electrode between the light emitting layer and the over coating layer, and a second electrode on the light emitting layer; and a black bank between the over coating layer and the light emitting device, wherein the first electrode covers a part of the black bank.

The light emitting display apparatus can further comprise a second bank between the first electrode and the light emitting layer.

The first electrode can include a reflective layer on the over coating layer and a transparent conductive layer on the reflective layer.

The light emitting display apparatus can further comprise a planarization layer between the reflective layer and the transparent conductive layer.

The plurality of convex portions or the plurality of concave portions of the over coating layer can be aperiodically disposed.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display apparatus, comprising:
   a substrate including a first area and a second area;
   an insulating layer on the substrate and having an uneven surface;
   a first bank on the insulating layer in the second area, and formed of a black material;
   a first electrode on the insulating layer in the first area, the first electrode covering at least a part of a side surface of the first bank and including a reflective layer and a transparent conductive layer on the reflective layer;
   a light emitting layer on the first electrode;
   a second electrode on the light emitting layer; and a planarization layer between the reflective layer and the transparent conductive layer, wherein the reflective layer is disposed along the uneven surface of the insulating layer.

2. The light emitting display apparatus of claim 1, wherein the insulating layer includes a plurality of convex portions and/or a plurality of concave portions in the first area and the second area, the first bank covers the plurality of convex portions and/or the plurality of concave portions of the insulating layer to planarize the second area, and the first electrode is disposed along an upper surface of the plurality of convex portions and/or concave portions in the first area.

3. The light emitting display apparatus of claim 2, wherein the plurality of convex portions and/or the plurality of concave portions of the insulating layer are aperiodically disposed.

4. The light emitting display apparatus of claim 1, wherein the first electrode covers the entire side surface of the first bank and at least a part of an upper surface of the first bank extending from the side surface of the first bank.

5. The light emitting display apparatus of claim 4, further comprising:

a thin film transistor on the substrate, wherein one of a source electrode and a drain electrode of the thin film transistor is connected to the first electrode via a contact hole extending from the upper surface of the first bank.

6. The light emitting display apparatus of claim 1, further comprising:

a second bank covering the first bank and the first electrode in the second area, and formed of a transparent material, wherein the light emitting layer and the second electrode are disposed on the second bank.

7. The light emitting display apparatus of claim 1, wherein the planarization layer further extends over the first bank, the reflective layer and a thin film transistor in the second area.

8. The light emitting display apparatus of claim 1, wherein the first and second areas are a part of a display area of the substrate.

9. A light emitting display apparatus, comprising:

a substrate;

an over coating layer having a plurality of convex portions or a plurality of concave portions on the substrate;

a light emitting device on the over coating layer, and the light emitting device including:

a light emitting layer, a first electrode between the light emitting layer and the over coating layer, and including a reflective layer on the over coating layer and a transparent conductive layer on the reflective layer, and a second electrode on the light emitting layer;

a black bank between the over coating layer and the light emitting device, and configured to reduce a degradation of a contrast ratio due to scattered reflection by the plurality of convex portions or the plurality of concave portions; and a planarization layer providing a planarized upper surface between the reflective layer and the transparent conductive layer so as to reduce a scattering reflectance of the reflective layer, wherein the first electrode covers a part of the black bank so as to reduce a degradation of the light extraction efficiency caused when the light emitted from the light emitting layer is absorbed by the black bank, and wherein the reflective layer of the first electrode is configured to upwardly reflect light emitted from the light emitting layer so as to improve a light extraction efficiency.

10. The light emitting display apparatus of claim 9, further comprising:

a second bank between the first electrode and the light emitting layer so as to reduce a short-circuit of the first electrode and the second electrode due to an inclined side surface of the black bank.

11. The light emitting display apparatus of claim 10, wherein the plurality of convex portions or the plurality of concave portions of the over coating layer are aperiodically disposed so as to reduce moiré interference due to the plurality of convex portions or the plurality of concave portions.

12. A light emitting display apparatus, comprising:

an over coating layer on a substrate, and including a plurality of convex portions or a plurality of concave portions;

a light emitting device on the over coating layer, and including a light emitting layer, a first electrode between the light emitting layer and the over coating layer, and a second electrode on the light emitting layer; and a black bank between the over coating layer and the light emitting device, wherein the first electrode covers a part of the black bank, wherein the first electrode includes a reflective layer on the over coating layer and a transparent conductive layer on the reflective layer, and wherein the light emitting display apparatus further includes a planarization layer between the reflective layer and the transparent conductive layer.

13. The light emitting display apparatus of claim 12, further comprising:

a second bank between the first electrode and the light emitting layer.

14. The light emitting display apparatus of claim 13, wherein the plurality of convex portions or the plurality of concave portions of the over coating layer are aperiodically disposed.

* * * * *